(12) United States Patent
Lin

(10) Patent No.: US 11,756,841 B2
(45) Date of Patent: Sep. 12, 2023

(54) METHOD FOR TESTING SEMICONDUCTOR ELEMENTS

(71) Applicant: Upper ELEC. CO., LTD., Tortoal (VG)

(72) Inventor: Shih Hung Lin, Taipei (TW)

(73) Assignee: UPPER ELEC. CO., LTD., Tortoal (VG)

( * ) Notice: Subject to any disclaimer, the term of this patent is extended or adjusted under 35 U.S.C. 154(b) by 23 days.

(21) Appl. No.: 17/393,896

(22) Filed: Aug. 4, 2021

(65) Prior Publication Data

US 2022/0189834 A1 Jun. 16, 2022

Related U.S. Application Data

(60) Provisional application No. 63/124,483, filed on Dec. 11, 2020.

(51) Int. Cl.
*H01L 21/66* (2006.01)
*H01L 23/00* (2006.01)

(52) U.S. Cl.
CPC .............. *H01L 22/32* (2013.01); *H01L 22/14* (2013.01); *H01L 24/24* (2013.01); *H01L 24/82* (2013.01); *H01L 24/98* (2013.01); *H01L 2224/24101* (2013.01); *H01L 2224/24137* (2013.01); *H01L 2224/82101* (2013.01); *H01L 2224/82106* (2013.01); *H01L 2224/98* (2013.01); *H01L 2924/12041* (2013.01); *H01L 2924/1421* (2013.01); *H01L 2924/1426* (2013.01)

(58) Field of Classification Search
CPC ..... H01L 224/02–04; H01L 2224/0231; H01L 2224/02311; H01L 2224/02313; H01L 2224/02331; H01L 2224/024; H01L 2224/03618; H01L 2224/0362; H01L 2224/05008; H01L 2224/05548; H01L 24/02–04; H01L 22/32
See application file for complete search history.

(56) References Cited

U.S. PATENT DOCUMENTS

| 9,786,571 | B1 * | 10/2017 | Zhang ...................... H01L 22/34 |
| 10,381,339 | B1 * | 8/2019 | Wang ................... G11C 29/006 |
| 2007/0111340 | A1 * | 5/2007 | Goldberger ............. H01L 22/32 257/E21.531 |
| 2014/0353820 | A1 * | 12/2014 | Yu ........................... H01L 24/13 257/737 |

FOREIGN PATENT DOCUMENTS

| CN | 114624557 | A | * | 6/2022 | ............. H01L 22/14 |
| CN | 115132703 | A | * | 9/2022 | |
| JP | 2003258047 | A | * | 9/2003 | |
| JP | 2005303163 | A | * | 10/2005 | |
| JP | 2021155364 | A | * | 10/2021 | |

* cited by examiner

*Primary Examiner* — David A Zarneke
(74) *Attorney, Agent, or Firm* — Chun-Ming Shih; HDLS IPR SERVICES

(57) ABSTRACT

Disclosed is a method for testing a semiconductor element. The method comprises forming at least one redistribution layer on a chip, utilizing the at least one redistribution layer to test an array of semiconductor elements on the chip, and removing the at least one redistribution layer from the chip, wherein the length of each semiconductor element is between 2-150 μm and the width of each semiconductor element is between 2-150 μm.

10 Claims, 21 Drawing Sheets

METHOD FOR TESTING SEMICONDUCTOR ELEMENTS

TECHNICAL FIELD

The present disclosure relates to a method for testing a semiconductor element, and particularly, to a method for testing a semiconductor element utilizing a redistribution layer.

BACKGROUND

Please refer to FIG. 1 illustrating a conventional method for testing a semiconductor element. As shown in the figure, a plurality of semiconductor elements 10 are configured on a substrate SUB, and each semiconductor element 10 includes a first metal pad 11 and a second metal pad 13. For a semiconductor element 10 such as a diode, the first metal pad 11 and the second metal pad 13 are connected to an anode and a cathode, respectively. The probe card 20 includes a plurality of probes 21. The spacing between the probes 21 is equal to the spacing between the first metal pad 11 and the second metal pad 13.

A probe card with a smaller probe spacing has a higher cost of manufacture, and such probe card has a higher cost of maintenance. For example, the probes are prone to be adhered with metal or metal oxide after contacting the metal pads for several times. Therefore, it needs to be cleaned or sent back to the original manufacturer for maintenance after several times of use. This makes the production line require to purchase multiple probe cards and thus production cost is increased.

Especially for mini LED products with a size of about 100 μm and micro LED products with a smaller spacing, the testing technology has become a key bottleneck in the production process.

SUMMARY OF THE INVENTION

An object of the present invention is to provide a method for testing a semiconductor element. The main steps include using a yellow light process to form a redistribution layer on the semiconductor element to be tested, and then the test probe does not directly contact the semiconductor element, while it contacts the redistribution layer for testing, and lastly the redistribution layer is removed by a dry, wet or mechanical grinding process.

An objective of the present invention is to provide a method for testing a semiconductor element. In the testing, a spacing between probes of a probe card is greater than a spacing between metal pads on the semiconductor element, so that the test process only requires a cost-effective probe card, instead of a finely manufactured and costly probe card.

Another objective of the present invention is to provide a method for testing semiconductor elements, which allows using one set of probes to test a plurality of semiconductor elements, and thus improves the speed of testing semiconductor elements.

Still another objective of the present invention is to provide a method for testing a semiconductor element, which mainly uses a redistribution layer on the semiconductor element to be tested, such that after the test is completed, no test probe marks are left on the semiconductor element.

These and other aspects will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The foregoing summary, as well as the following detailed description of the invention, will be better understood when read in conjunction with the appended drawing. In the drawings.

DESCRIPTION OF THE INVENTION

Unless defined otherwise, all technical and scientific terms used herein have the same meaning as commonly understood by a person skilled in the art to which this invention belongs.

As used herein, the singular forms "a", "an", and "the" include plural referents unless the context clearly dictates otherwise. Thus, for example, reference to "a sample" includes a plurality of such samples and equivalents thereof known to those skilled in the art.

Figure 1:
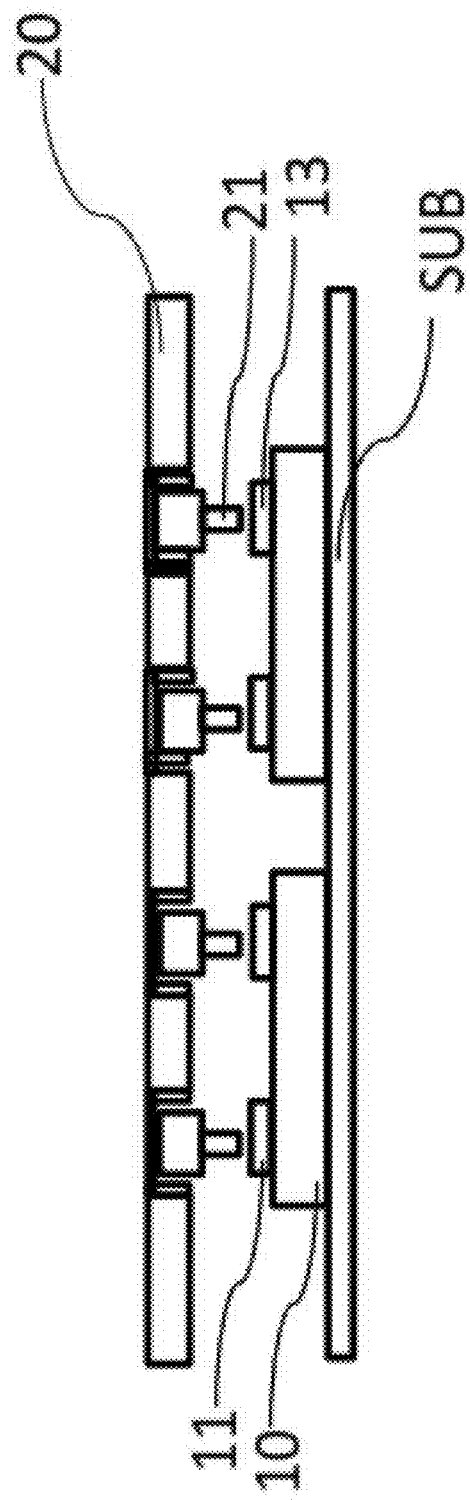
FIG. 1 illustrates a conventional method for testing a semiconductor element.
Figure 2A:
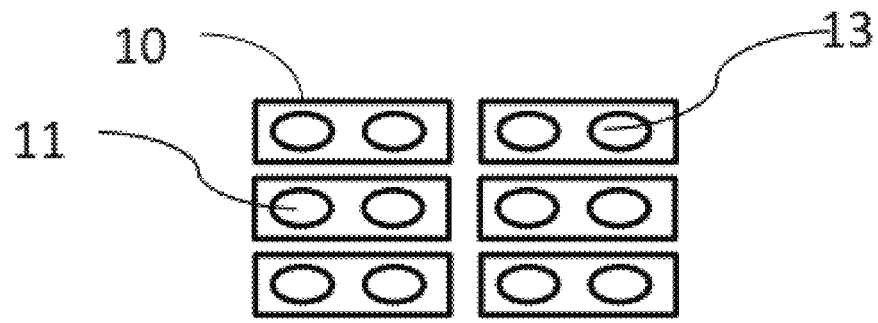
FIG. 2A and FIG. 2B illustrate testing a plurality of semiconductor elements using one set of probes according to one embodiment of the present invention.
Figure 2B:
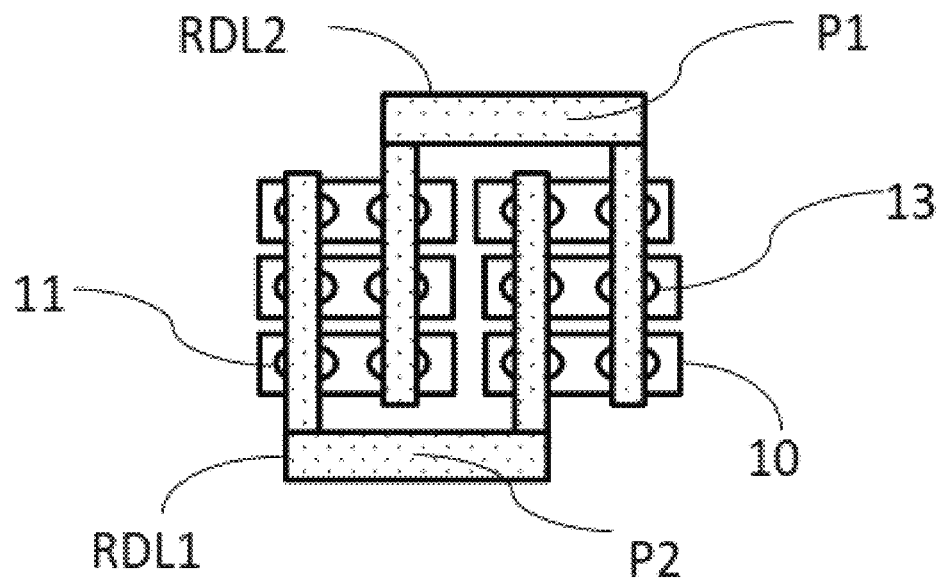

Please refer to FIG. 2A and FIG. 2B. FIG. 2A shows an array of semiconductor elements to be tested. Here, taking an array of six semiconductor elements 10 as an example, each semiconductor element 10 has a first metal pad 11 and a second metal pad 13. The length of each semiconductor element 10 is between 2-150 μm and the width of each semiconductor element 10 is between 2-150 μm. Referring to FIG. 2B, a yellow light process is used to form redistribution layers RDL1 and RDL2 on the semiconductor elements 10. The redistribution layer RDL1 is connected to the first metal pads 11 of the six semiconductor elements 10, and the redistribution layer RDL2 is connected to the second metal pads 12 of the six semiconductor elements 10, wherein a wider part P1 of RDL1 and a wider part P2 of RDL2 are where a probe contacts. In this way, an array of semiconductor elements 10 can be tested one set of probes, and a spacing between the probes is several times the spacing between the metal pads 11 and 13.

The embodiment as shown in FIG. 2B demonstrates that one set of probes can be used to test two columns or two rows of semiconductor elements of a semiconductor element array. In actual semiconductor element array products, there are usually tens, hundreds, or thousands of semiconductor elements in a column or in a row, so it is very efficient to test an array of semiconductor elements by adopting this embodiment.

Figure 3:
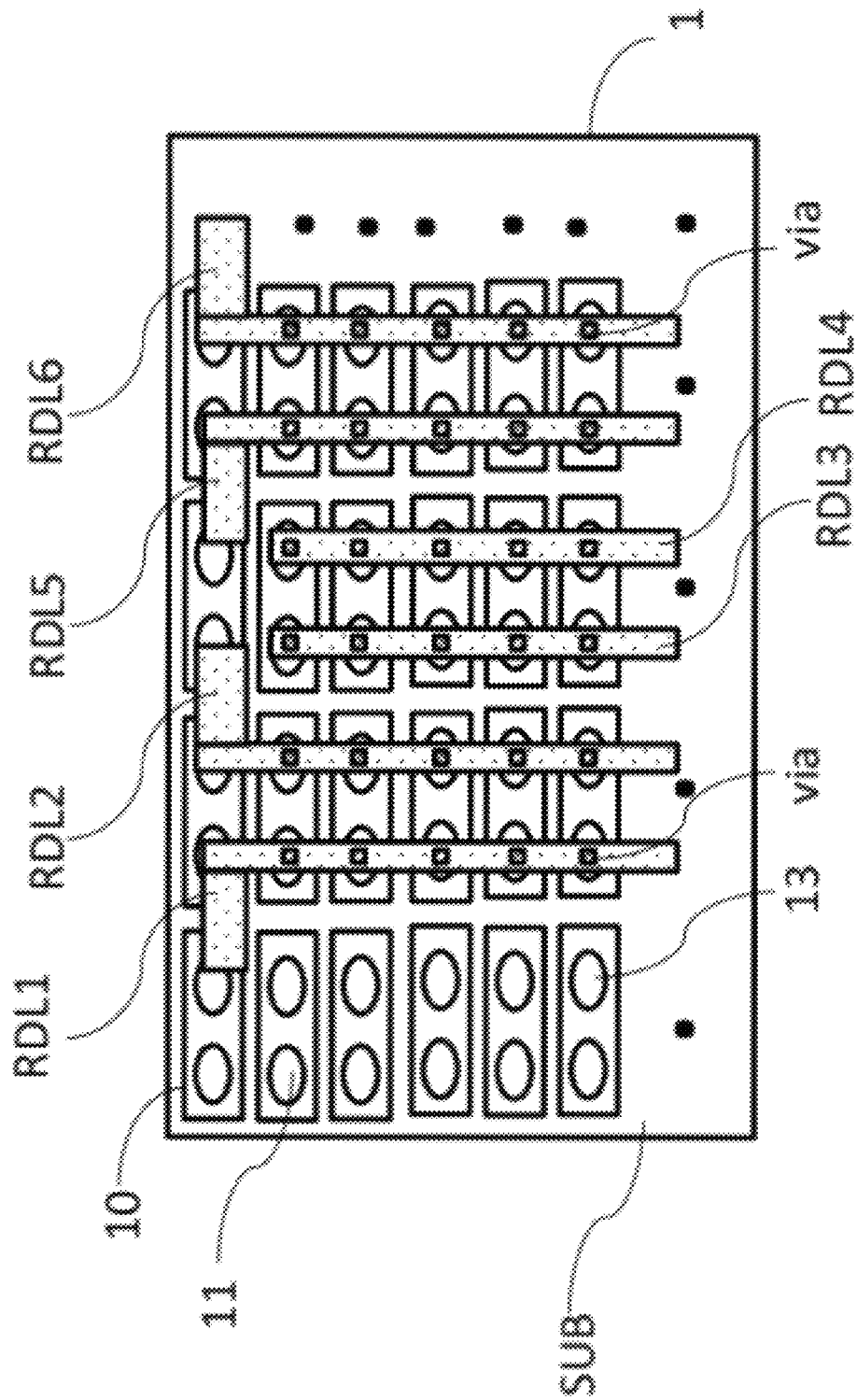
FIG. 3 illustrates utilizing at least one redistribution layer to test an array of semiconductor elements according to another embodiment of the present invention.

Now please refer to FIG. 3. Shown is a chip 1 comprises a plurality of semiconductor elements 10 on a substrate SUB. Each semiconductor element 10 includes a first metal pad 11 and a second metal pad 13. In order to test the semiconductor elements 10, a yellow light process is used to fabricate redistribution layers on the chip 1, the redistribution layers including redistribution layers RDL1 to RDL6 and other redistribution layers not shown in the figure. As can be seen in FIG. 3, since the border of the chip 1 and the spacing between the semiconductor elements 10 are narrow, the semiconductor elements 10 of the top row, the bottom row, the first column, and the last column are not tested. However, according to the characteristics of the semiconductor manufacturing process, if the semiconductor elements 10 are arranged in a matrix with N columns of semiconductor elements 10 and M rows of semiconductor elements 10, and (N−2)×(M−2) semiconductor elements 10 pass the test, then the defective rate of the untested semiconductor elements 10 on the edge part is fairly low. This is an acceptable test method according to statistical quality control.

As shown in FIG. 3, the redistribution layers RDL1 to RDL6 are respectively connected to the first metal pads 11 or the second metal pads 13 of a row of N−2 semiconductor elements 10. For example, the redistribution layer RDL1 is connected to each of the first metal pads 11 of N−2 semiconductor elements 10 by a through hole via, which is a tubular opening between a circuit redistribution layer and a metal pad. An inner wall of the tubular opening is coated with a conductive metal to connect the circuit redistribution layer and the metal pad. For the convenience of description, the illustrated through hole via on a redistribution layer in FIG. 3 means that the redistribution layer is connected to a metal pad below at that position by the through hole via, otherwise there is an insulating layer between the redistribution layer and a metal pad below for isolation. For example, a wider part of the redistribution layer RDL1 at the uppermost row is where the probe contacts. Although it overlaps with a first metal pad 11 or a second metal pad 13 below, the two metal layers are separated by an insulating layer therebetween.

Referring to in FIG. 3 again, the redistribution layers RDL1 and RDL2 as a pair, the redistribution layers RDL3 and RDL4 as a pair, and the redistribution layers RDL5 and RDL6 as a pair, each tests N−2 semiconductor elements 10. Since a part on a redistribution layer contacting with a probe requires to be relatively wide, the position of probe testing of two adjacent rows of semiconductor elements 10 in this embodiment is located at the uppermost column and the lowermost column. For example, respective wider parts of the redistribution layers RDL1 and RDL2 at the uppermost column are where probes contact, and respective wider parts (not shown) of the redistribution layers RDL3 and RDL4 at the lowest column (not shown) are where probes contact.

In the embodiment illustrated by FIG. 3, in an N×M semiconductor element array, (N−2)×(M−2) semiconductor elements 10 are tested, and therefore the test rate is (N−2)× (M−2)/(N×M). When the semiconductor manufacturing process is stable, the test data is tracked, the yield rate rises steadily, and the failure mode is derivable from the analysis data, the test rate can be moderately reduced such that the redistribution layer forming process is simplified and easier to control.

Figure 4:
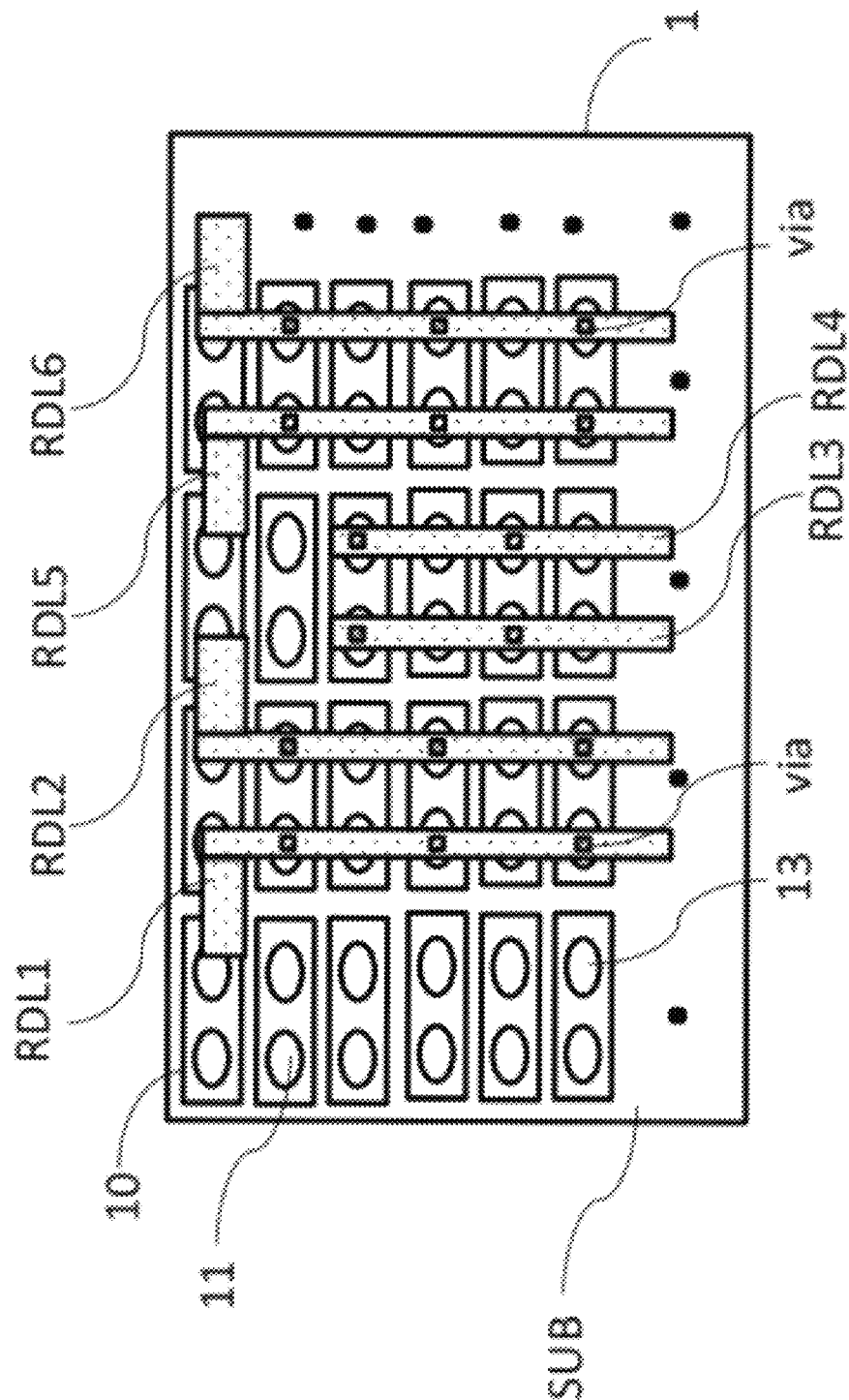
FIG. 4 illustrates utilizing at least one redistribution layer to test an array of semiconductor elements according to still another embodiment of the present invention.

Please refer to FIG. 4. Shown is a chip 1 comprises a plurality of semiconductor elements 10 on a substrate SUB. Each semiconductor element 10 includes a first metal pad 11 and a second metal pad 13. In order to test the semiconductor elements 10, a yellow light process is used to fabricate redistribution layers on the chip 1, the redistribution layers including redistribution layers RDL1 to RDL6 and other redistribution layers not shown in the figure. Since the border of the chip 1 and the spacing between the semiconductor elements 10 are narrow, the semiconductor elements 10 of the top row, the bottom row, the first column, and the last column are not tested. Further, the number of through holes via in this embodiment is half that of the embodiment illustrated by FIG. 3, and the test rate is about half that of the embodiment illustrated by FIG. 3. As shown in FIG. 4, the distribution of the through holes via is relatively dispersed, which is easier to implement in a manufacturing process, and is relatively unaffected by process defects. Similarly, the shortest distance between the redistribution layers RDL1 to RDL6 of the present embodiment is farther than that of the embodiment illustrated by FIG. 3, which is easier to implement in a manufacturing process, and is relatively unaffected by process defects.

Figure 5:
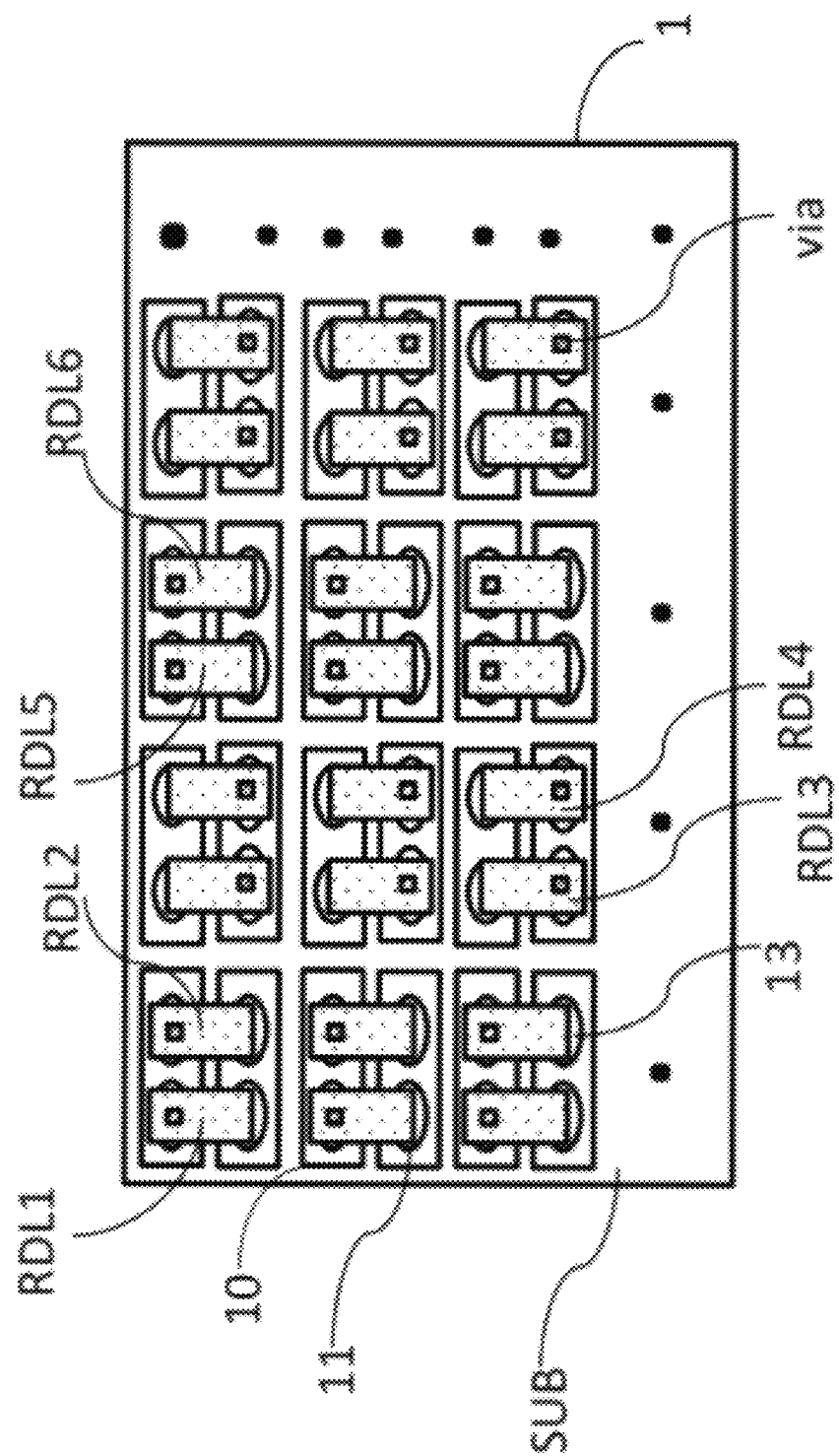
FIG. 5 illustrates utilizing at least one redistribution layer to test an array of semiconductor elements according to another embodiment of the present invention.

Please refer to FIG. 5. Shown is a chip 1 comprises a plurality of semiconductor elements 10 on a substrate SUB. Each semiconductor element 10 includes a first metal pad 11 and a second metal pad 13. In order to test the semiconductor elements 10, a yellow light process is used to form redistribution layers on the chip 1, the redistribution layers including redistribution layers RDL1 to RDL6 and other unlabled redistribution layers. The test rate of this embodiment is 50%, and the semiconductor elements 10 are individually and independently tested. The layout of the redistribution layer and the test method of this embodiment are suitable for an early stage of mass production, allowing collection of a large number of failure modes for reference in yield improvement. As shown in FIG. 5, the redistribution layers RDL1 and RDL2 can be used to test the semiconductor element 10 in the upper left corner, but the semiconductor element 10 in the second row below is not to be tested. The redistribution layers RDL3 and RDL4 can be used to test the semiconductor element 10 at second column, sixth row, but the semiconductor device 10 in the fifth row above is not to be tested. That is, the testing pattern of this embodiment is equivalent to that of a conventional checkerboard test. In the present embodiment, the redistribution layer extends along a vertical direction on the chip 1, but the present invention is not limited thereto. In cases that the length and width of the semiconductor device 10 are different, the redistribution layer may extend along a vertical direction or be in a square layout to implement a 50% test rate checkerboard-like test, and other similar embodiments are repeated here.

A skilled artisan can understand from the above description that according to the stability and maturity of a semiconductor manufacturing process and the test yield data of the semiconductor elements, and utilizing a big data analysis, suitable redistribution layer layout can be chosen in implementing a method of testing a semiconductor element of the present invention.

Figure 6A:
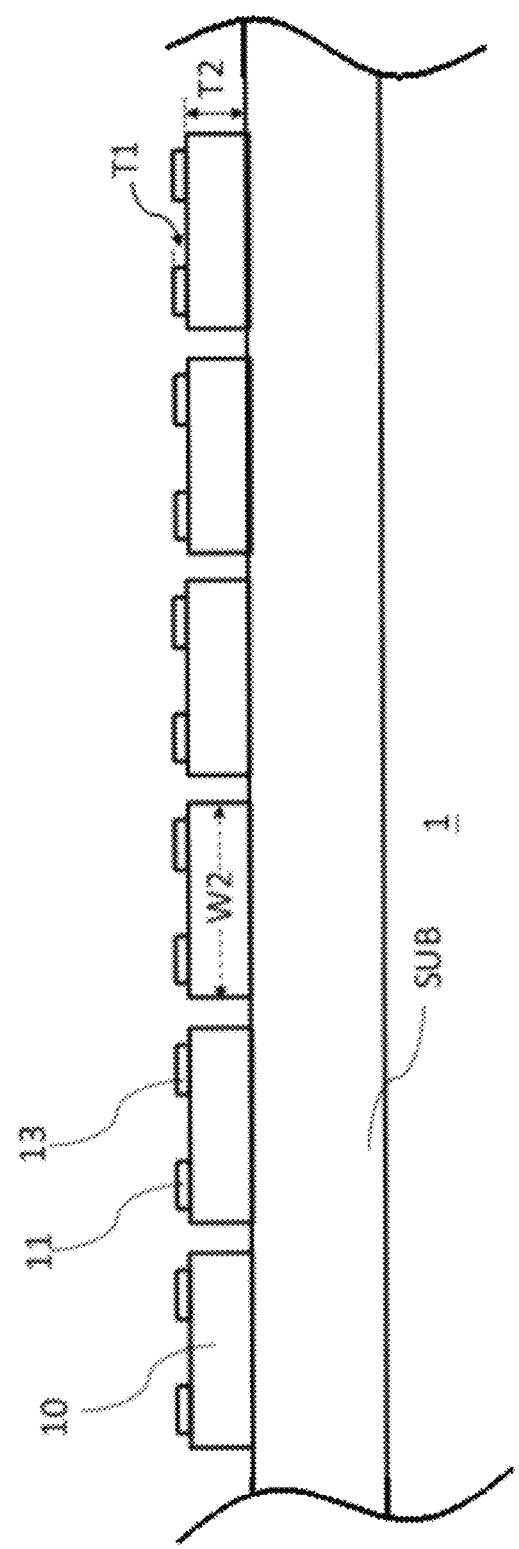
FIGS. 6A-6L illustrate a process of forming a redistribution layer according to one embodiment of the present invention.

Now please refer to FIGS. 6A-6I illustrating a process for forming a redistribution layer. As shown in FIG. 6A, chip 1 comprises a plurality of semiconductor elements 10 on a substrate SUB. Each semiconductor device 10 includes a first metal pad 11 and a second metal pad 13. The first metal pad 11 and the second metal pad 12 are a metal layer, the thickness of which is between 0.1-1 µm, and the material of which is a metal such as gold, etc. The width W2 of each semiconductor element 10 is between 2-150 µm, and its thickness is between 3-20 µm. The material of each semiconductor element 10 may independently be sapphire ($Al_2O_3$), silicon (Si), silicon carbide (SiC), or gallium nitride (GaN), or other epitaxial substrates. The chip 1 may be a wafer with a size ranging from 4 to 8 inches, or a wafer die.

Figure 6B:
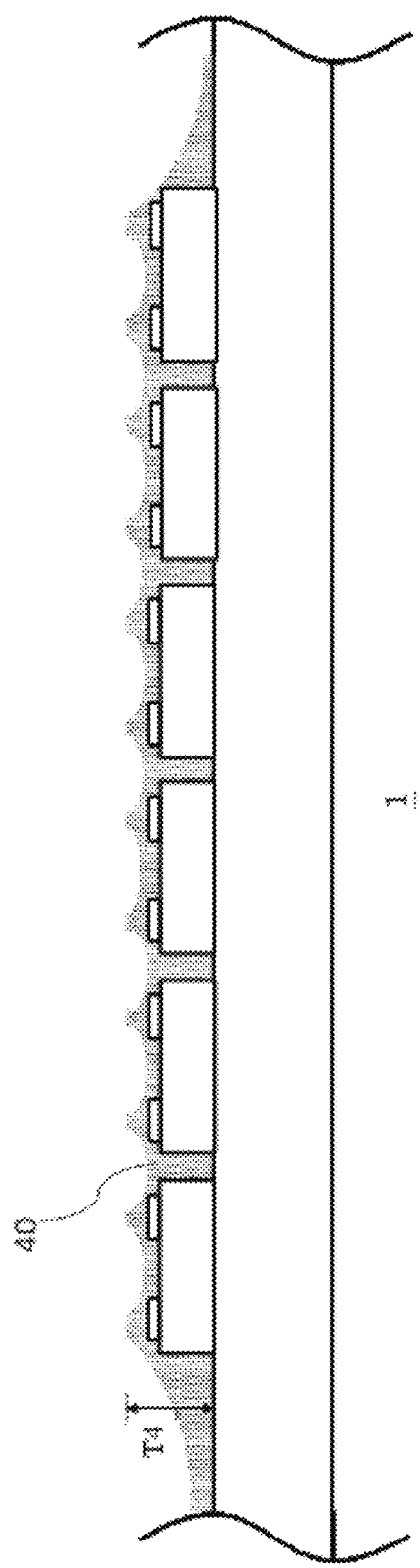

Referring to FIG. 6B, a first photoresist layer 40 with a thickness T4 ranging from 1 to 30 µm is coated on the surface of chip 1 to be tested. The first photoresist layer 40 may be a positive photoresist or a negative photoresist, and its material may be a polyimide (PI), a diazonaphthoquinone (DNQ), a polyolefin, or a chemically amplified (CA) photoresist material, or other photoresist materials.

Figure 6C:
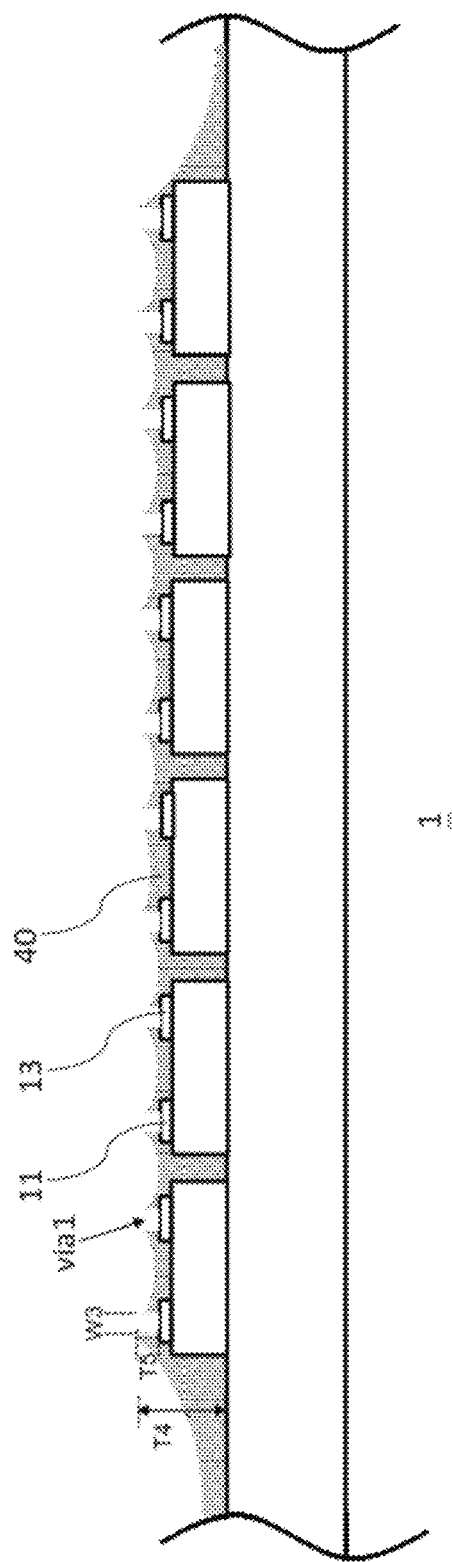

As shown in FIG. 6C, in order to expose first metal pads 11 and second metal pads 13 below the first photoresist layer 40, first through holes via1 are produced using a yellow light process including exposure and development, etc. The exposure light source may be of ultraviolet light, for example, an i-line light source (365 nm). Developing solutions such as tetramethylammonium hydroxide (TMAH), propylene glycol methyl ether acetate (PGMEA), monoethanolamine (MEA) or cyclopentanone may be used in a wet process development to remove photoresists. The development mode may include developing in a tank, single wafer spinning, or horizontal handling. The width (diameter) W3 of each first through holes via1 is between 0.5-40 µm, and the depth (axial length) T5 of each first through holes via1 is between 0.5-10 µm. Further, in the present embodiment, a first through holes via1 is produced above each of the first metal pads 11 and the second metal pads 13 on the semiconductor elements 10. In other embodiments, layout of which metal pad is to be configured with a first through hole via1 may be decided based on a desired test rate. For example, layouts as shown in the above-mentioned embodiments illustrated by FIG. 3 to FIG. 5.

Figure 6D:
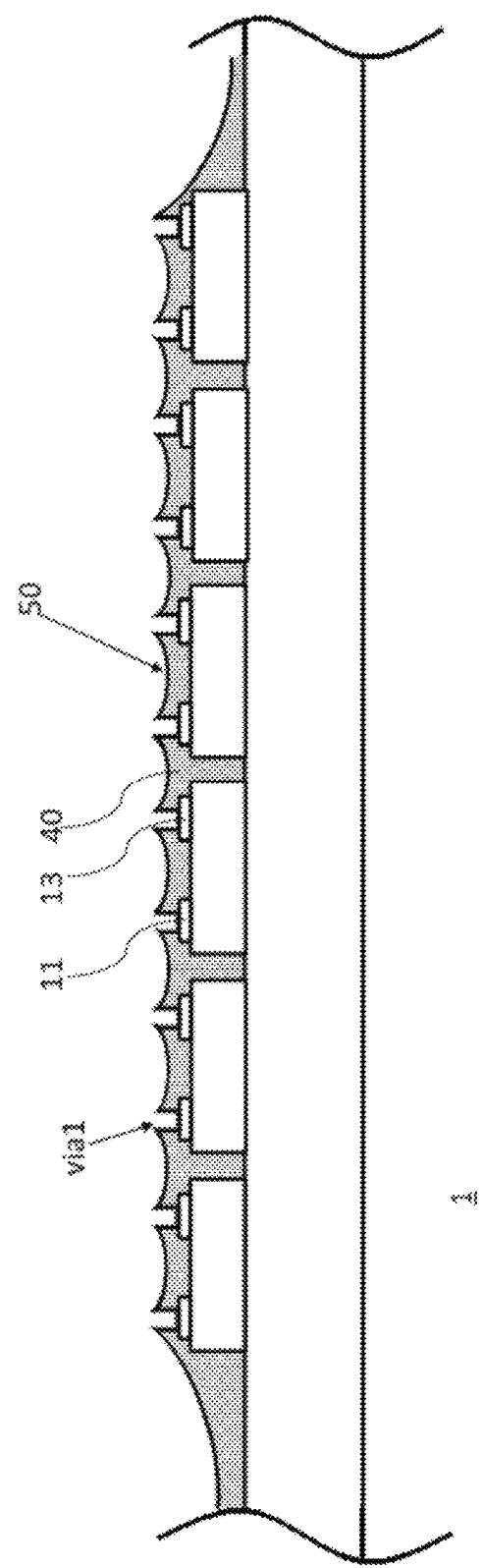

Referring to FIG. 6D, a metal seed layer 50 is plated on the surface of the first through holes via1 and the first photoresist layer 40 by a method such evaporation or sputtering, to enable the selected first metal pads 11 or second metal pads 13 to establish electrical connection with a redistribution layer to be superimposed thereon. The material of the metal seed layer 50 may be copper (Cu), titanium (Ti), gold (Au), or silver (Ag). The thickness of the metal seed layer 50 is preferably between 0.02-3 µm. For example, the metal seed layer 50 may be a copper coating of 0.05-3 µm, or a titanium coating of 0.02-1 µm.

Figure 6E:
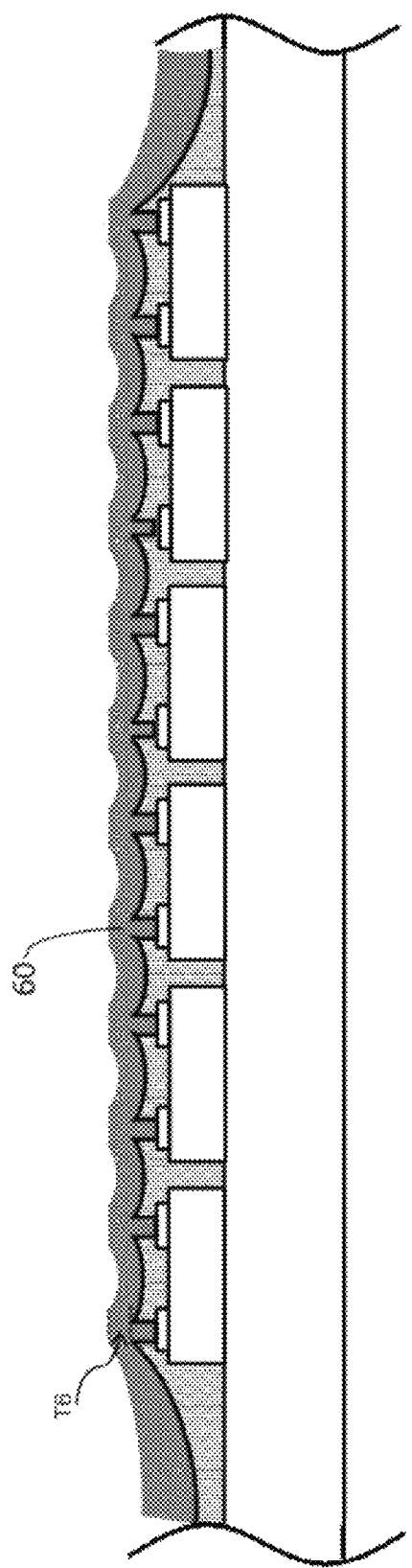

Subsequently, as shown in FIG. 6E, a second photoresist layer 60 is coated on the surface of the wafer. The thickness T6 of the second photoresist layer 60 is between 1-30 µm. The second photoresist layer 60 may be a positive photoresist or a negative photoresist, and its material may be a polyimide (PI), a diazonaphthoquinone (DNQ), a polyolefin, or a chemically amplified (CA) photoresist material, or other photoresist materials.

Figure 6F:
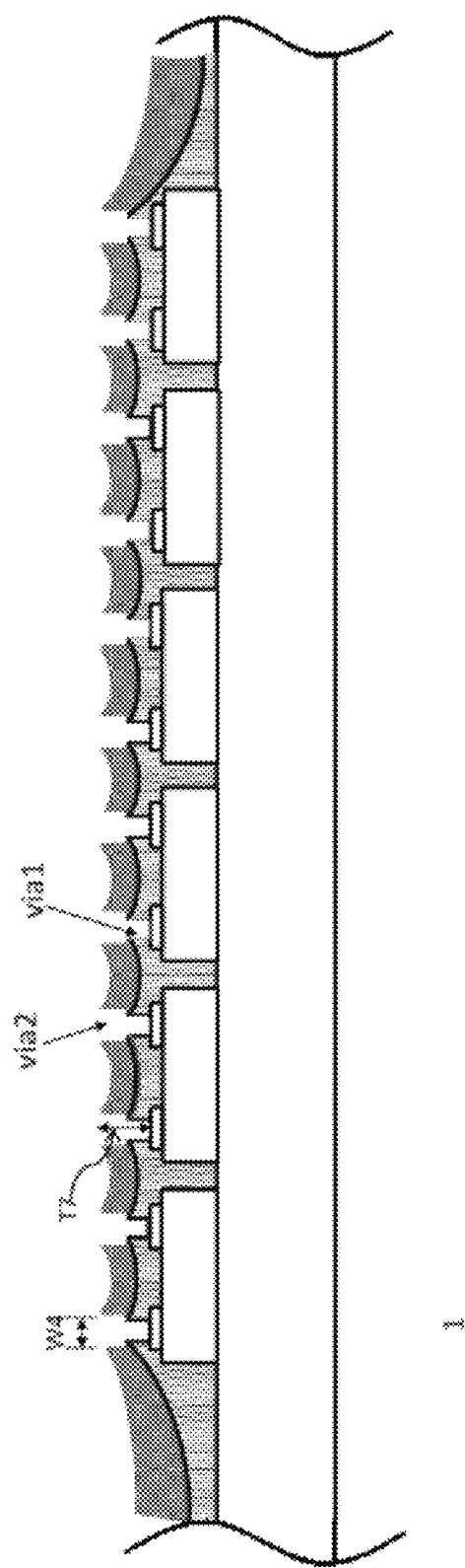

As shown in FIG. 6F, in order to allow filling of metal into the first through holes via1 on the metal seed layer 50, a second through hole via2 is produced on the top of each first through hole via1 using a yellow light process including exposure and development, etc. The exposure light source may be of ultraviolet light, for example, an i-line light source (365 nm). Developing solutions such as tetramethylammonium hydroxide (TMAH), propylene glycol methyl ether acetate (PGMEA), monoethanolamine (MEA) or cyclopentanone may be used in a wet process development to remove photoresists. The development mode may include developing in a tank, single wafer spinning, or horizontal handling. The width (diameter) W4 of each second through holes via2 is between 0.5-200 µm, and the depth (axial length) T7 of each second through holes via2 is between 0.5-30 µm.

Figure 6G:
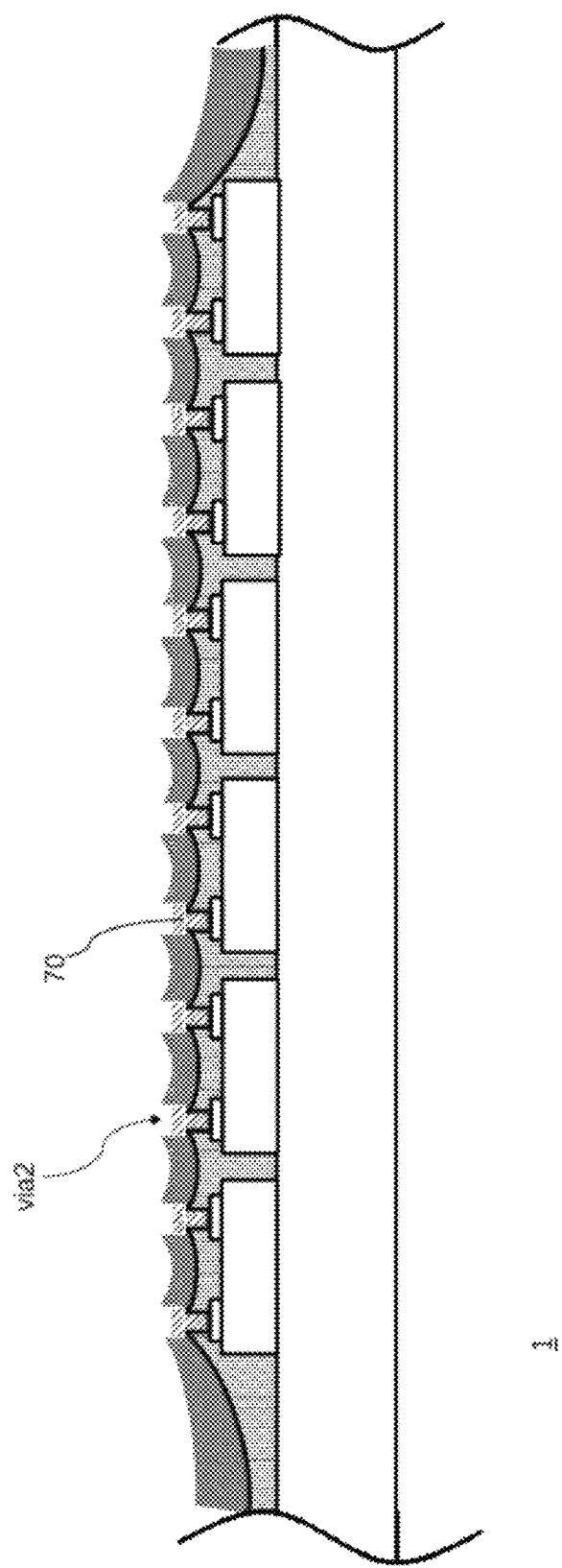

Referring to FIG. 6G, a copper pillar layer 70 is then plated onto the metal seed layer 50 exposed by the second through holes via2. A metal electroplating process is performed using copper (Cu) as an electroplating material. Copper will deposit on the surface of the metal seed layer 50 to form a copper pillar layer 70 in the second through holes via2. The thickness of a copper pillar layer 70 is between 0.5-25 µm.

Figure 6H:
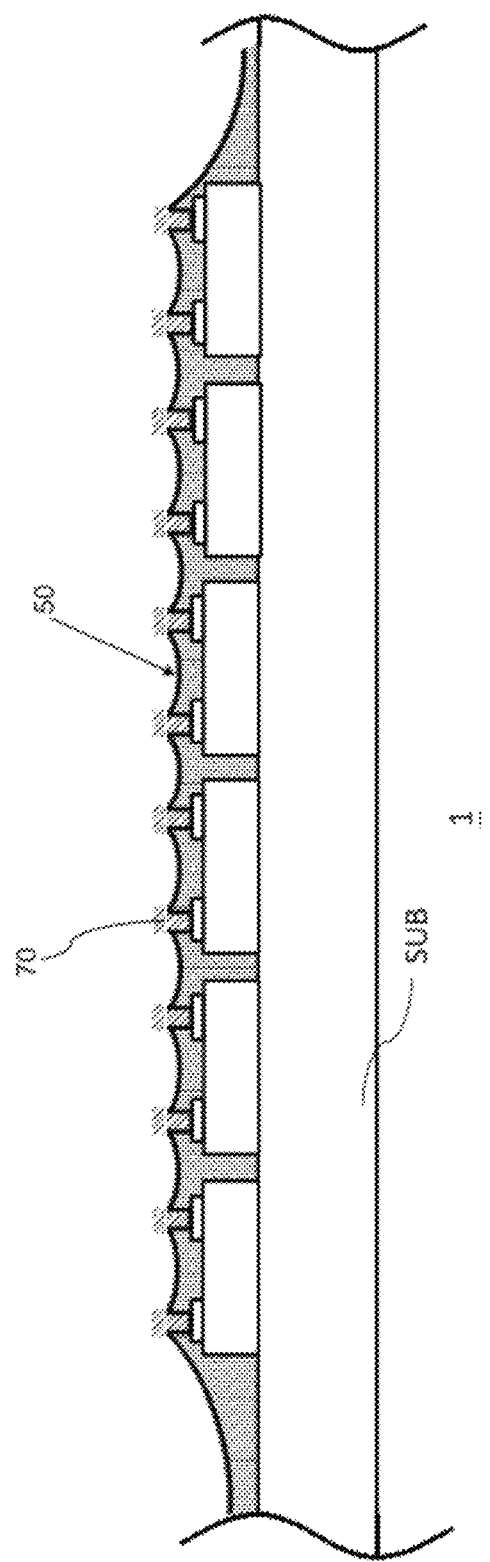
Figure 6I:
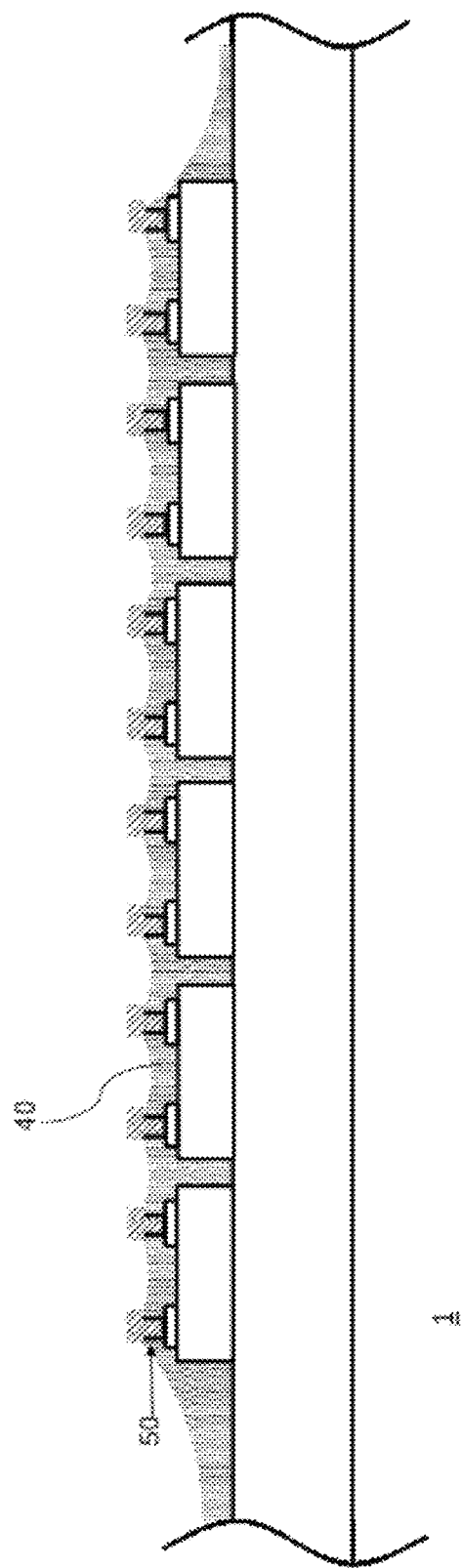

Later, the second photoresist layer 60 is removed by a photoresist removing process including a wet chemical removal and a plasma dry etching, etc. The chip 1 with the second photoresist layer 60 removed is illustrated in FIG. 6H. Subsequently, the metal seed layer 50 on the first photoresist layer 40 is removed by a chemical wet etching to obtain a redistribution layer on the chip 1 as shown in FIG. 6I.

Figure 6J:
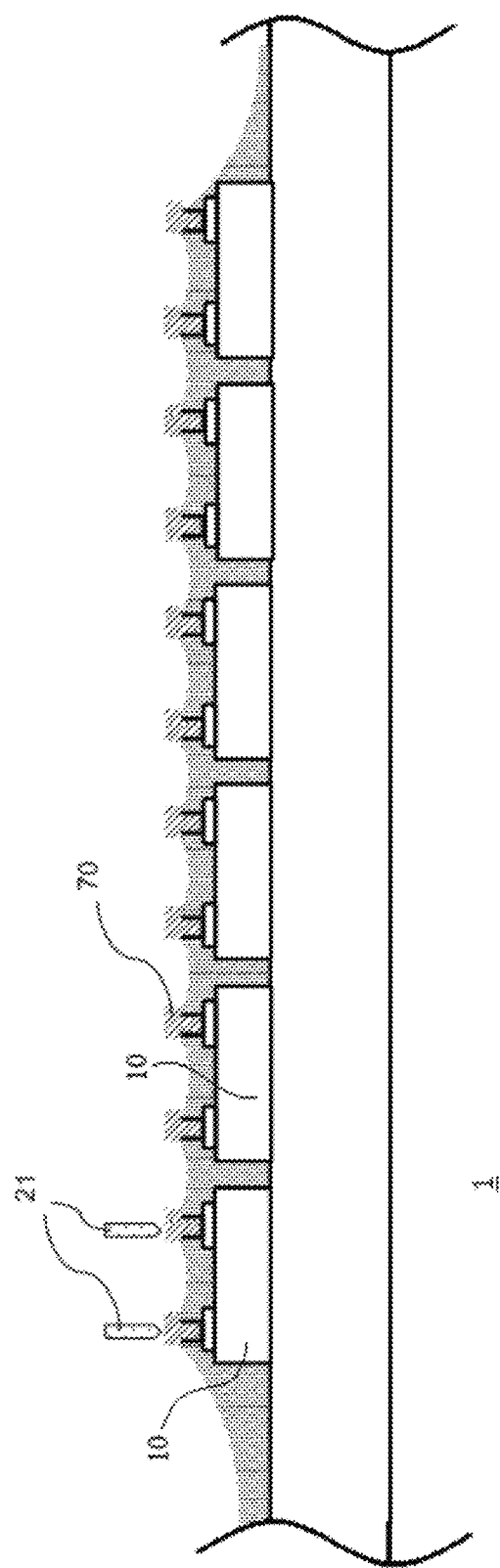

Referring to FIG. 6J, after a redistribution layer including a copper pillar layer 70 is formed, probes 21 may be used to test a semiconductor element 10. The number of semiconductor elements 10 tested in a single test is different due to different layout of the redistribution layer, which may be ranging from 1 to 100,000 semiconductor elements 10 in a single test, and the tests are performed sequentially until completion.

Figure 6K:
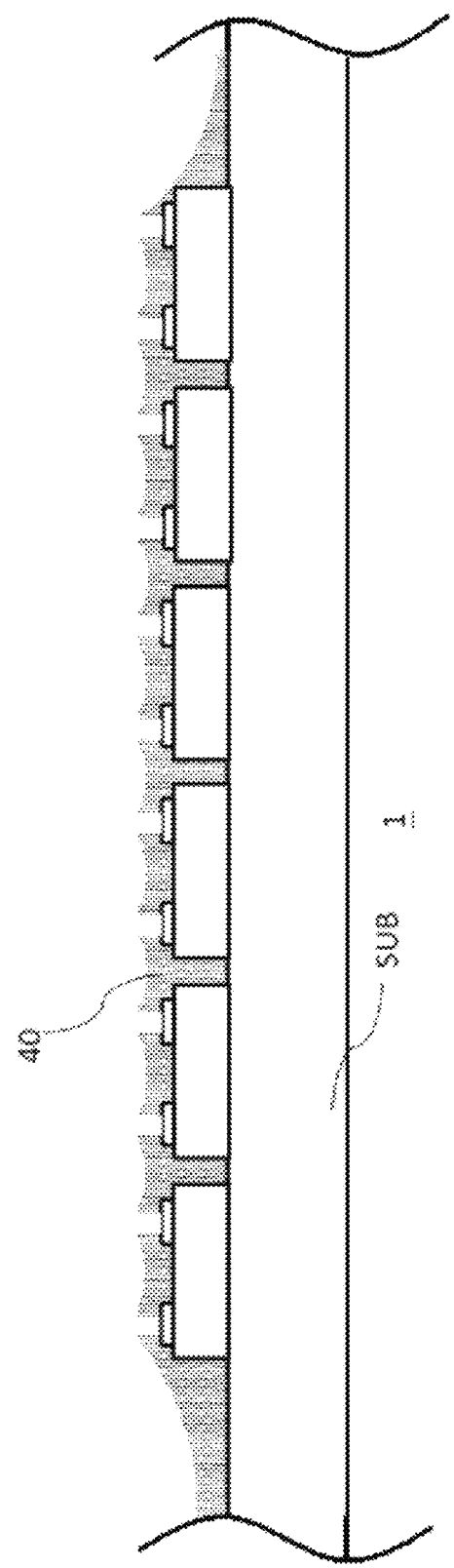
Figure 6L:
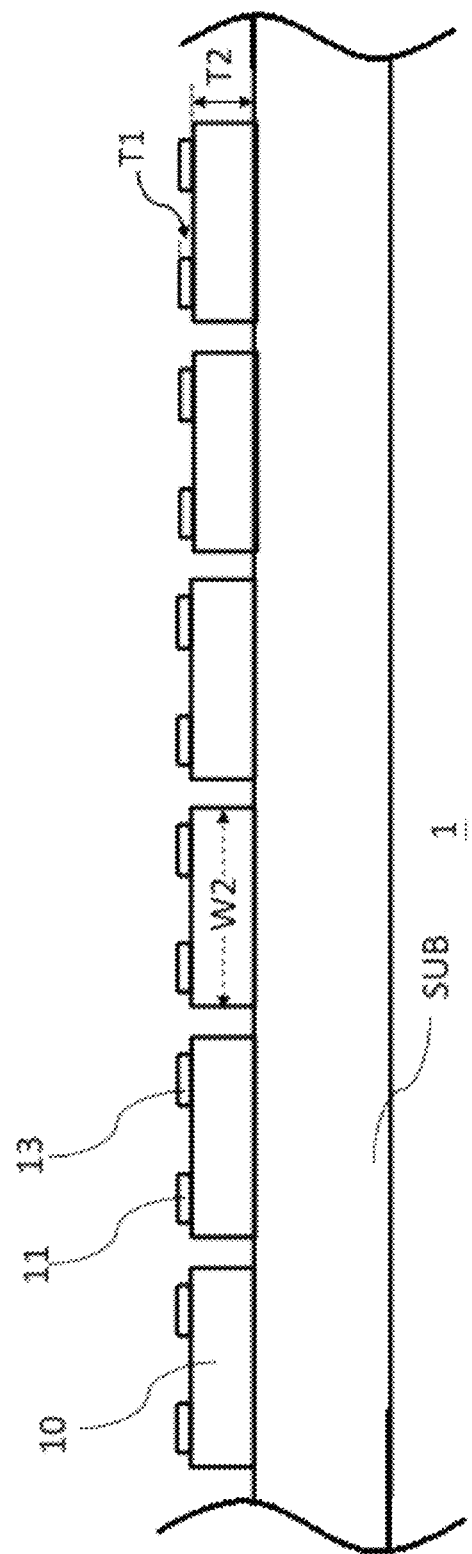

Now please refer to FIG. 6K and FIG. 6L. After the tests are completed, a chemical wet etching method is used to remove the copper pillar layer 70 and the metal seed layer 50. The chip 1 with the copper pillar layer 70 and the metal seed layer 50 removed is illustrated in FIG. 6K. Subsequently, the first photoresist layer 40 is removed by a photoresist removing process including a wet chemical removal and a plasma dry etching, etc. The chip 1 with the first photoresist layer 40 removed is illustrated in FIG. 6L. After the redistribution layer is removed, the chip 1 seems to return to the similar condition as shown in FIG. 6A illustrated a chip 1 to be tested. However, although the metal seed layer 50 on the first metal pads 11 and the second metal pads 13 of the semiconductor elements 10 has been removed, a residual metal of the metal seed layer 50 is detectable therefrom. Similarly, although the first photoresist layer 40 on other positions has also been removed, a residual material of the first photoresist layer 40 is detectable therefrom. The chip 1 after test as shown in FIG. 6L may have no probe marks or only a few probe marks thereon, but the test data has been collected in a test machine.

Figure 7:
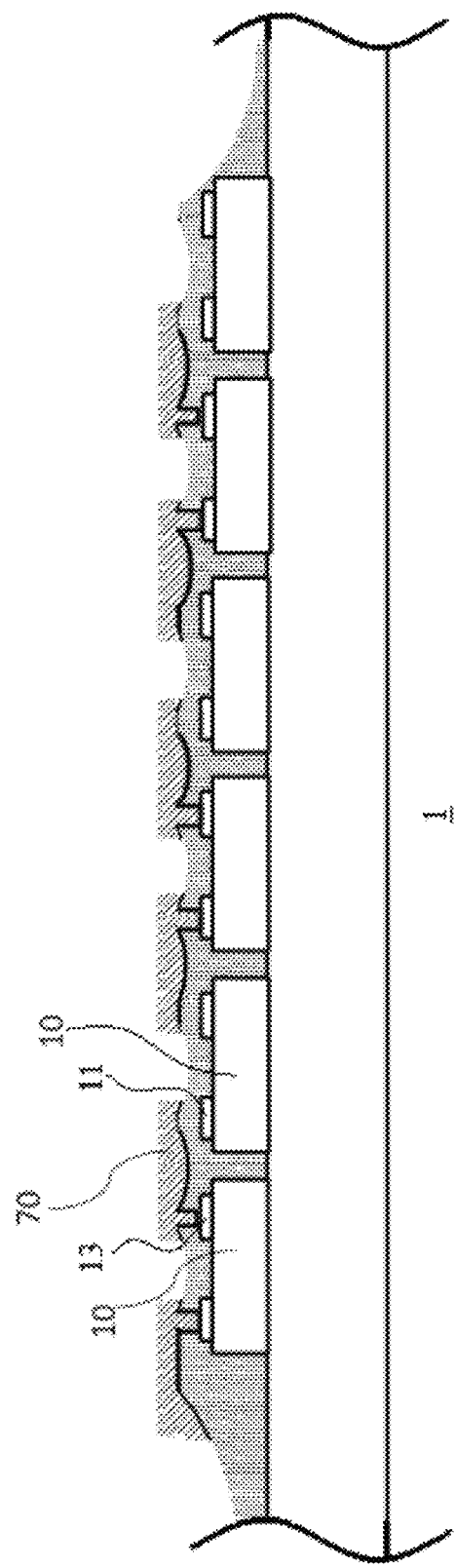
FIG. 7 is a sectional view of a redistribution layer formed on a chip according to another embodiment of the present invention.

Please refer to FIG. 7, which shows a different layout of a redistribution layer. As shown in FIG. 7, a redistribution layer including a copper pillar layer 70 is formed on a chip 1. The redistribution layer extends across two semiconductor elements 10, and covers a first metal pad 11 of one semiconductor element 10 and a second metal pad 13 of the other semiconductor element 10. To make a redistribution layer including a wider copper pillar layer 70, of course a width (diameter) of a second through hole via2 in the manufacturing process needs to be wider; however, the manufacturing process is similar to that illustrated in FIGS. 6A to 6I and described above, and thus is not repeated here.

FIG. 7 can be regarded as a cross-sectional view of the chip 1 shown in FIG. 5, where of two adjacent semiconductor elements 10, only one of the semiconductor elements 10 has a through hole via on a first metal pad 11 and the second metal pad 13, so the test rate is 50%. Especially for metal pads with a tiny size such that even if an expensive precision probe card is used, there is still a bottleneck in testing semiconductor elements, an embodiment as illustrated by FIG. 7 is an efficient and cost-effective alternative. Furthermore, since a large size metal pad is not required to be configured on a wafer, more semiconductor elements can be arranged on a unit wafer. If there is a need for a test rate of 100%, it can be achieved by changing the position of the through hole via and performing two semiconductor component tests with a test rate of 50%. Another embodiment with a test rate of 50% is similar to that illustrated in FIG. 7 and is not repeated here.

The various embodiments described above are not limitations to the scope of the claimed invention. The present invention is particularly advantageous in testing semiconductor elements arranged in an array, but its application is not limited thereto. In general, the present invention may be used in any occasion where a test by direct contacting the metal pads of semiconductor elements is not desired. More importantly, in view that the semiconductor manufacturing technology is continuously developing towards miniaturization, by adopting a method for testing a semiconductor element of the present invention, the size of metal pads configured on semiconductor elements can be reduced, so can the size of a chip that includes such semiconductor elements. Accordingly, a method of the present invention is applicable to a semiconductor element including a mini LED, a micro LED, a driver IC, or an RFID IC, and is applicable to a wafer, a wafer die, or a chip in a process of packaging.

In semiconductor manufacturing processes, multiple metal layers are used in wire connection to reduce the size of the chip. A redistribution layer of the present invention may also adopt a multi-redistribution layer structure to perform the test of semiconductor elements. For a multi-redistribution layer structure, an insulating layer is formed between different redistribution layers, and a lower redistribution layer is connected to a top redistribution layer by a through hole. For example, in one embodiment similar to that illustrated in FIGS. 6A to 6I and described above, a multi-redistribution layer structure is formed and includes a plurality of copper pillar layers, wherein an inter-metal dielectric (IMD) such as undoped silicate glass and fluorinated silicate glass is used to insulate different copper pillar layers, and a lower copper pillar layer is connected to a top copper pillar layer by a through hole.

Figure 8A:
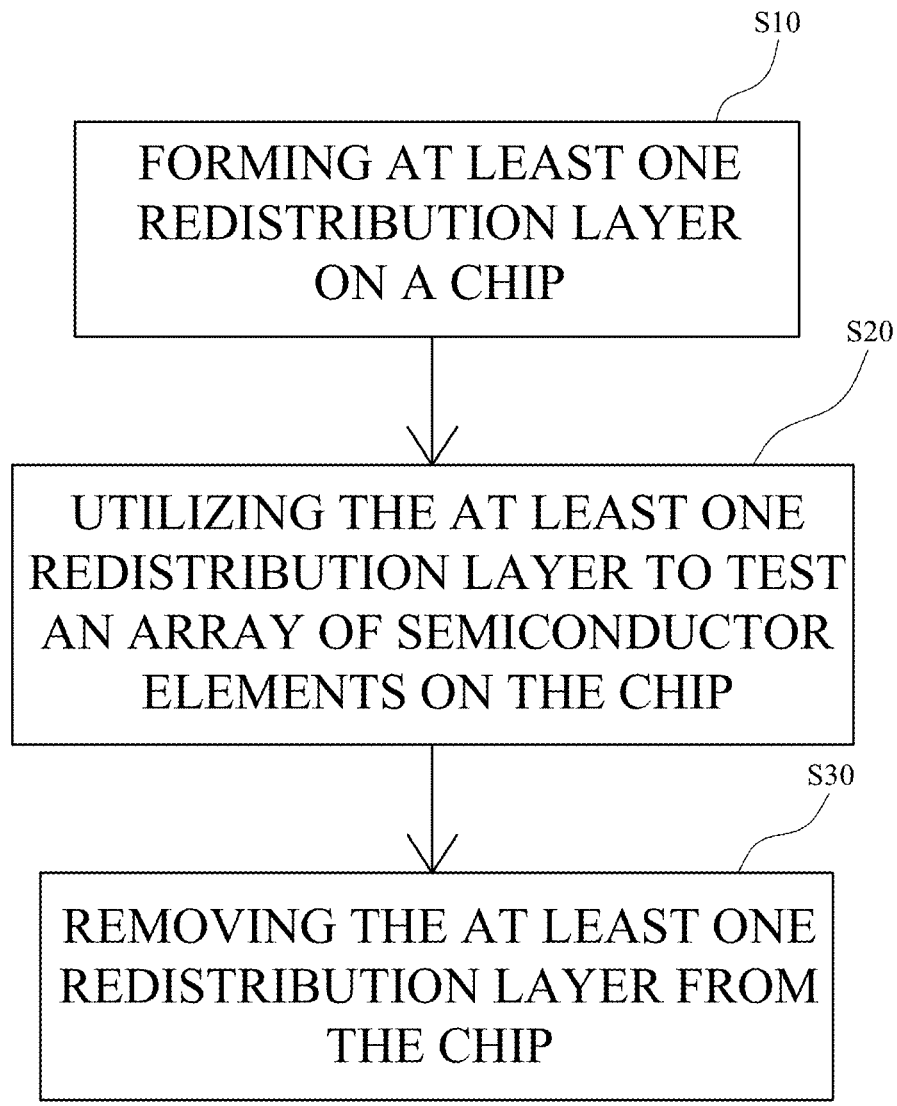
FIG. 8A is a flowchart of a method of testing a semiconductor element according to one embodiment of the present invention.

Now please refer to FIG. 8A, which is a flowchart of a method of testing a semiconductor element according to one embodiment of the present invention. The method comprises: forming at least one redistribution layer on a chip (step S10), utilizing the at least one redistribution layer to test an array of semiconductor elements on the chip (step S20), and removing the at least one redistribution layer from the chip (step S30), wherein the length of each semiconductor element is between 2-150 µm and the width of each semiconductor element is between 2-150 µm.

Figure 8B:
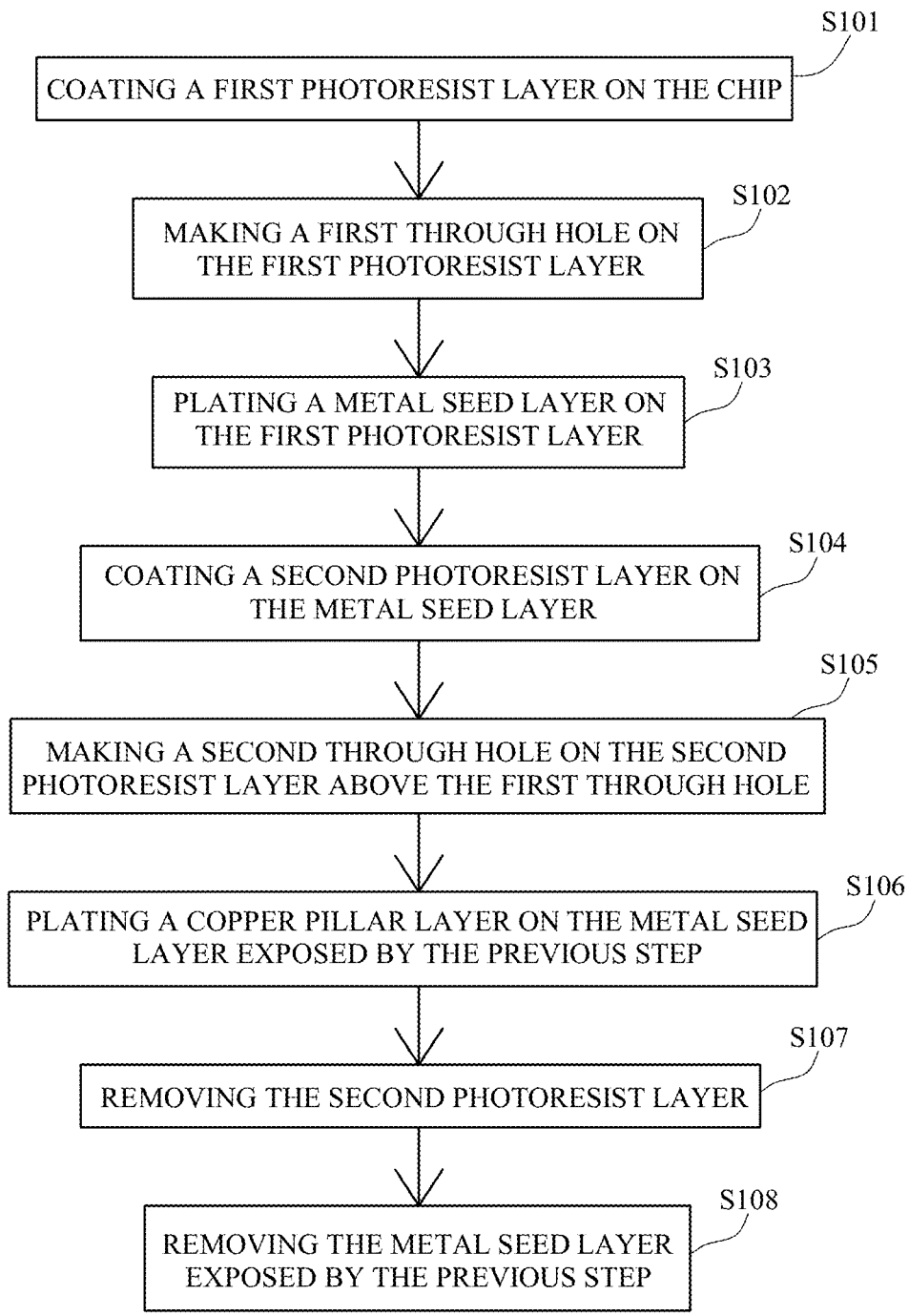
FIG. 8B is a flowchart of a process of forming a redistribution layer according to one embodiment of the present invention.

Please refer to FIG. 8B, which is a flowchart of a process of forming a redistribution layer according to one embodiment of the present invention. The method comprises: coating a first photoresist layer on the chip (step S101), making a first through hole on the first photoresist layer (step S102), plating a metal seed layer on the first photoresist layer (step S103), coating a second photoresist layer on the metal seed layer (step S104), making a second through hole on the second photoresist layer above the first through hole (step S105), plating a copper pillar layer on the metal seed layer exposed by the previous step (step S106), removing the second photoresist layer (step S107), and removing the metal seed layer exposed by the previous step (step S108).

Figure 8C:
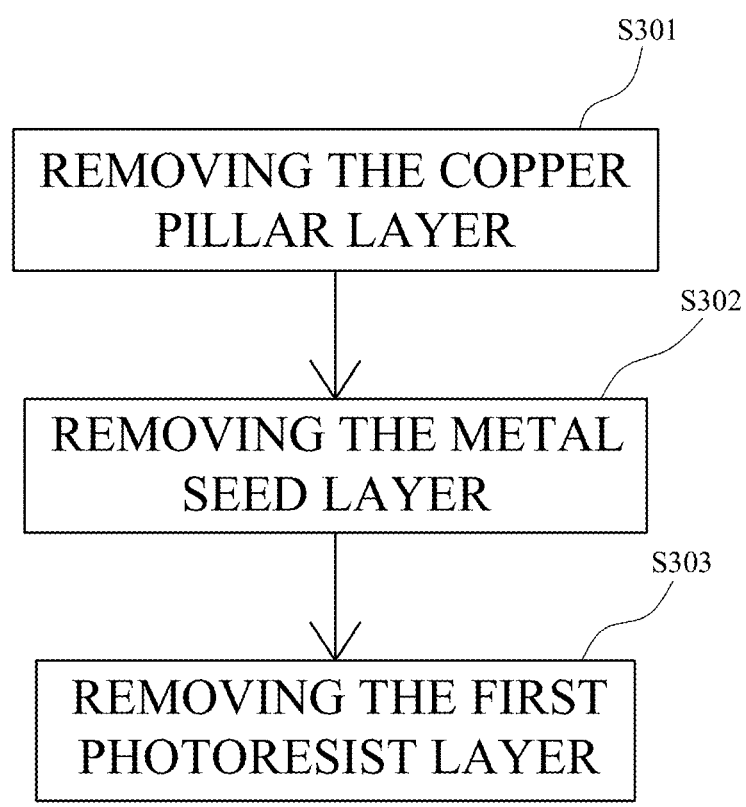
FIG. 8C is a flowchart of a process of removing a redistribution layer according to one embodiment of the present invention.

Please refer to FIG. 8C, which is a flowchart of a process of removing a redistribution layer according to one embodiment of the present invention. The method comprises: removing the copper pillar layer (step S301), removing the metal seed layer (step S302), and removing the first photoresist layer (step S303).

It is believed that a person of ordinary knowledge in the art where the present invention belongs can utilize the present invention to its broadest scope based on the descriptions herein with no need of further illustration. Therefore, the descriptions and claims as provided should be understood as of demonstrative purpose instead of limitative in any way to the scope of the present invention.

The invention claimed is:

1. A method for testing semiconductor elements arranged in an array with columns of semiconductor elements and rows on a substrate of a chip; wherein each of the semiconductor elements includes a first metal pad and a second metal pad arranged in the row where the semiconductor element is located; the method comprising:
   (i) forming redistribution layers on the chip; wherein the redistribution layers are respectively connected to the first metal pads or the second metal pads of one of columns of semiconductor elements; and at least one of the redistribution layers is provided with a wider part at the uppermost row overlapping with one of the first metal pads or one of the second metal pads with an insulating layer therebetween;
   (ii) utilizing the at least one redistribution layer to test an array of semiconductor elements on the chip; wherein at least one probe is utilizing to contact with the wider part of the at least one of the redistribution layers, and does not contact with the semiconductor elements; and
   (iii) removing the at least one redistribution layer from the chip;
   wherein the length of each semiconductor element is between 2-150 µm and the width of each semiconductor element is between 2-150 µm.

2. The method of claim 1, wherein each of the semiconductor elements is independently a mini LED, a micro LED, a driver IC, or an RFID IC.

3. The method of claim 1, wherein step (i) comprises:
   (1) coating a first photoresist layer on the chip;
   (2) making a first through hole on the first photoresist layer;
   (3) plating a metal seed layer on the first photoresist layer;
   (4) coating a second photoresist layer on the metal seed layer;
   (5) making a second through hole on the second photoresist layer above the first through hole;
   (6) plating a copper pillar layer on the metal seed layer exposed by step (5);
   (7) removing the second photoresist layer; and
   (8) removing the metal seed layer exposed by step (7).

4. The method of claim 1, wherein a thickness of the first photoresist layer is between 1-30 µm.

5. The method of claim 1, wherein a width of the first through hole is between 0.5-40 µm, and a depth of the first through hole is between 0.5-10 µm.

6. The method of claim 1, wherein a thickness of the metal seed layer is between 0.02-3 μm.

7. The method of claim 1, wherein a width of the second through hole is between 0.5-200 μm, and a depth of the second through hole is between 0.5-30 μm.

8. The method of claim 1, wherein a thickness of the copper pillar layer is between 0.5-25 μm.

9. The method of claim 1, wherein step (iii) comprises:
 removing the copper pillar layer;
 removing the metal seed layer; and
 removing the first photoresist layer.

10. The method of claim 1, wherein a material of the first photoresist layer is a polyimide, a diazonaphthoquinone, a polyolefin, or a chemically amplified photoresist material, and a material of the metal seed layer is copper, titanium, gold or silver.

* * * * *